United States Patent
Ishihara et al.

(10) Patent No.: US 7,884,466 B2
(45) Date of Patent: Feb. 8, 2011

(54) SEMICONDUCTOR DEVICE WITH DOUBLE-SIDED ELECTRODE STRUCTURE AND ITS MANUFACTURING METHOD

(75) Inventors: Masamichi Ishihara, Kitakyushu (JP); Fumihiko Ooka, Tokyo (JP); Yoshihiko Ino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 351 days.

(21) Appl. No.: 12/279,402

(22) PCT Filed: Apr. 9, 2007

(86) PCT No.: PCT/JP2007/057812

§ 371 (c)(1),
(2), (4) Date: Aug. 14, 2008

(87) PCT Pub. No.: WO2007/125744

PCT Pub. Date: Nov. 8, 2007

(65) Prior Publication Data

US 2009/0072381 A1    Mar. 19, 2009

(30) Foreign Application Priority Data

Apr. 25, 2006    (JP)    ............... 2006-120127

(51) Int. Cl.
*H01L 23/12*    (2006.01)

(52) U.S. Cl. ............. 257/700; 438/22; 438/23; 438/24; 438/25; 438/26; 438/27; 438/28; 438/29; 438/30; 438/31; 438/32; 438/33; 438/34; 438/35; 438/36; 438/37; 438/38; 438/39; 438/40; 438/41; 438/113; 438/106; 257/99; 257/673; 257/676; 257/E23.033; 257/E21.599

(58) Field of Classification Search ............. 438/22–47, 438/113, 106; 257/99, 676, 673, E23.033, 257/E21.599, E21.705, 700, E23.116, E21.499
See application file for complete search history.

(56) References Cited

U.S. PATENT DOCUMENTS

| | | | | |
|---|---|---|---|---|
| 4,143,508 A | * | 3/1979 | Ohno | 368/88 |
| 4,729,061 A | * | 3/1988 | Brown | 361/719 |
| 5,432,677 A | * | 7/1995 | Mowatt et al. | 361/719 |
| 5,583,378 A | * | 12/1996 | Marrs et al. | 257/710 |

(Continued)

FOREIGN PATENT DOCUMENTS

JP    63-61150    4/1988

(Continued)

*Primary Examiner*—Fernando L Toledo
*Assistant Examiner*—Ankush K Singal
(74) *Attorney, Agent, or Firm*—McGlew and Tuttle, P.C.

(57) ABSTRACT

According to the present invention, a recess portion is formed in a package substrate which is formed of a multilayer organic substrate having a multilayer wiring, and an LSI chip is accommodated within the recess portion. Wiring traces are formed on the upper surface of a resin which seals the LSI chip connected to the multilayer wiring. The wiring traces are connected to terminal wiring traces connected to the multi-layer wiring on the front face of the package substrate and to front-face bump electrodes for external connection on the upper surface of the resin. On the back face side of the package substrate, back-face bump electrodes for external connection are formed and connected to the multilayer wiring.

10 Claims, 6 Drawing Sheets

BUMP (CONNECTION PROJECTIONS) ATTACHMENT ON FRONT AND BACK FACES

U.S. PATENT DOCUMENTS

| | | | | |
|---|---|---|---|---|
| 5,847,935 A | * | 12/1998 | Thaler et al. | 361/761 |
| 5,907,187 A | * | 5/1999 | Koiwa et al. | 257/737 |
| 6,014,318 A | * | 1/2000 | Takeda | 361/764 |
| 6,020,637 A | * | 2/2000 | Karnezos | 257/738 |
| 6,153,928 A | * | 11/2000 | Cho | 257/686 |
| 6,154,366 A | * | 11/2000 | Ma et al. | 361/704 |
| 6,501,168 B1 | * | 12/2002 | Castro et al. | 257/700 |
| 6,538,210 B2 | * | 3/2003 | Sugaya et al. | 174/258 |
| 6,819,565 B2 | * | 11/2004 | Kao et al. | 361/704 |
| 6,864,165 B1 | * | 3/2005 | Pogge et al. | 438/612 |
| 6,876,554 B1 | * | 4/2005 | Inagaki et al. | 361/763 |
| 6,916,682 B2 | * | 7/2005 | Gerber et al. | 438/106 |
| 6,991,966 B2 | * | 1/2006 | Tuominen | 438/118 |
| 7,242,092 B2 | * | 7/2007 | Hsu | 257/723 |
| 7,307,852 B2 | * | 12/2007 | Inagaki et al. | 361/760 |
| 7,732,909 B2 | * | 6/2010 | Tuominen | 257/687 |
| 2004/0012698 A1 | | 1/2004 | Suda et al. | |
| 2004/0036081 A1 | * | 2/2004 | Okazaki | 257/99 |
| 2004/0041249 A1 | * | 3/2004 | Tsai et al. | 257/686 |
| 2005/0156323 A1 | * | 7/2005 | Tokunaga | 257/778 |
| 2005/0161804 A1 | * | 7/2005 | Iijima et al. | 257/700 |
| 2005/0253247 A1 | | 11/2005 | Imoto et al. | |
| 2005/0269128 A1 | | 12/2005 | Usui et al. | |
| 2006/0214288 A1 | | 9/2006 | Ohsumi | |
| 2007/0132104 A1 | * | 6/2007 | Farnworth et al. | 257/774 |

FOREIGN PATENT DOCUMENTS

| | | |
|---|---|---|
| JP | 10-150118 | 6/1998 |
| JP | 11-168150 | 6/1999 |
| JP | 2001-127243 | 5/2001 |
| JP | 2001-230515 | 8/2001 |
| JP | 2002-158312 | 5/2002 |
| JP | 2003-031955 | 1/2003 |
| JP | 2003-249604 | 9/2003 |
| JP | 2005-235824 | 9/2005 |
| JP | 2005-317861 | 11/2005 |
| JP | 2005-347654 | 12/2005 |
| JP | 2005-353644 | 12/2005 |
| JP | 2006-210872 | 8/2006 |
| JP | 2006-245226 | 9/2006 |
| KR | 20050006092 | 1/2005 |
| WO | WO 2005/122230 | 12/2005 |

* cited by examiner

CROSS SECTION OF PACKAGE SUBSTRATE

EXTERNAL VIEW OF PACKAGE SUBSTRATE

LSI CHIP DIE BONDING

WIRE BONDING

CAVITY PORTION RESIN SEALING

FIG. 7
MOLD FRONT FACE REWIRING
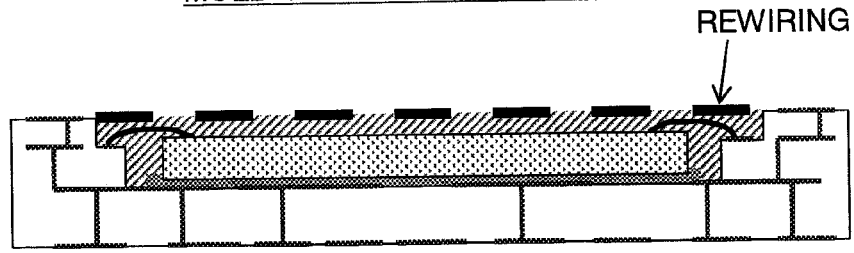
FIG. 8
BUMP (CONNECTION PROJECTIONS) ATTACHMENT ON FRONT AND BACK FACES
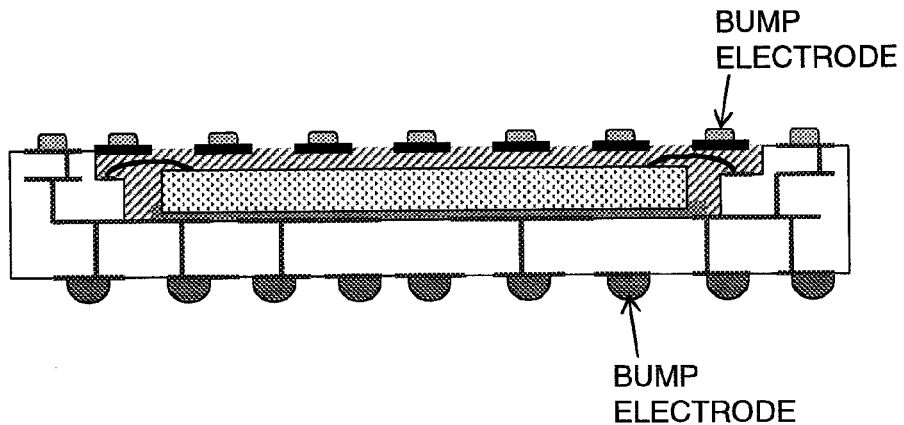
FIG. 9(A)         FIG. 9(B)
EXAMPLE WIRING PATTERNS
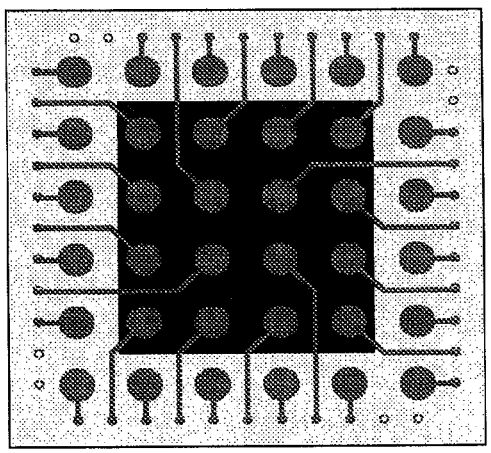
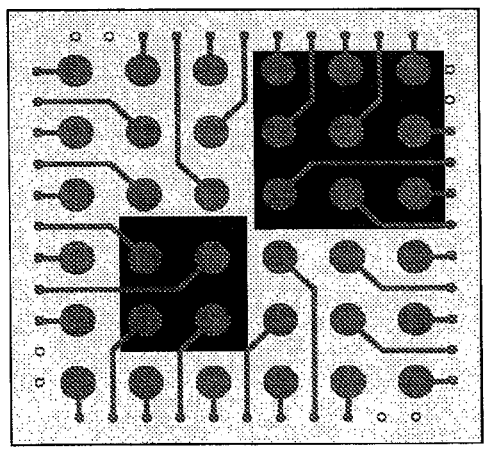

SEMICONDUCTOR DEVICE WITH DOUBLE-SIDED ELECTRODE STRUCTURE AND ITS MANUFACTURING METHOD

TECHNICAL FIELD

The present invention relates to a semiconductor device having a double-sided electrode structure which can be used in small-sized electronic devices, such as cellular phones and digital cameras, small-sized robots, and small-sized sensors, and to a method of manufacturing such a semiconductor device.

BACKGROUND ART

In association with an increase in the degree of integration of LSI chips, there has been strong demand for a reduction in package size. Under the circumstances, various package structures have been proposed. In recent years, developments have been carried out intensively for stacking semiconductor bare chips through utilization of through-silicon vias formed therein. Meanwhile, dual-face packages of real chip size are also highly likely to be commercialized. Conventional dual-face packages of any technology require a through-silicon via structure (refer to Patent Document 1). Since existing insulation methods for through holes in a semiconductor substrate involve high-temperature treatment, application of such insulation methods to a semiconductor packaging process is difficult. Formation of through holes in a semiconductor substrate and insulation for the through holes still involve problems to be solved; therefore, wiring that does not require through-silicon vias is desired.

Patent Document 2 discloses a lead-frame-type double-sided electrode package in which the package is vertically penetrated by a lead frame. However, since the arrangement of electrodes on the lower face of the package is identical with that of electrodes on the upper face of the package, the package has no flexibility in connection between the upper and lower faces.

Patent document 3 discloses a BGA-type double-sided electrode package in which electrodes penetrating through a substrate are provided so as to form a double-sided electrode structure. However, since electrode placement portions on the upper surface are the penetrating electrodes themselves, the package has no flexible in a pattern of connection with an upper-side IC.

Patent Document 4 discloses a double-sided electrode structure in which protrusion electrodes are formed on a substrate. However, Patent Document 4 discloses neither a method of forming the protrusion electrodes nor a connection method. Although Patent Document 4 discloses rewiring on the upper surface, the disclosed method for effecting rewiring is a conventional method in which a low-resistance metallic film is formed through upper surface plating, and a pattern is formed by use of lithography. Therefore, the disclosed double-sided electrode structure has a big problem in terms of cost.

Patent Document 1: Japanese Patent Application Laid-Open (kokai) No. 2001-127243

Patent Document 2: Japanese Patent Application Laid-Open (kokai) No. 2003-249604

Patent Document 3: Japanese Patent Application Laid-Open (kokai) No. 2005-235824

Patent Document 4: Japanese Patent Application Laid-Open (kokai) No. 2002-158312

DISCLOSURE OF THE INVENTION

Problems to be Solved by the Invention

An object of the present invention is to solve the above-mentioned problems and to allow low-cost manufacture of a thin double-sided electrode package in which rewiring can be freely formed on an upper surface of a substrate, to thereby facilitate connection with an upper side IC.

Another object of the present invention is to enable a plurality of chips to be embedded in a single substrate, and to enable an arbitrary number of wiring traces to extend to arbitrary positions of upper and lower portions of the substrate, to thereby impart flexibility to a pattern of connection with an upper side IC.

Means for Solving the Problems

A semiconductor device having a double-sided electrode structure of the present invention includes a package substrate which is formed of a multilayer organic substrate having a multilayer wiring. A recess portion is formed in the package substrate, and an LSI chip is accommodated within the recess portion. A resin is charged for sealing around and on the LSI chip to a height equal to that of the uppermost surface of the package substrate, the LSI chip being mounted in the recess portion of the package substrate and being connected to the multilayer wiring. Wiring traces are formed on an upper surface of the charged resin such that the wiring traces are connected to wiring traces for terminals (hereinafter referred to as "terminal wiring traces") connected to the multilayer wiring on a front face of the package substrate, and are connected to front-face bump electrodes for external connection on the upper surface of the resin. On the back face side of the package substrate, back-face bump electrodes for external connection are formed and connected to the multilayer wiring.

Step portions are formed around the recess portion of the package substrate, and the terminal wiring traces connected to the multilayer wiring are formed on the step portions. The terminal wiring traces, which serve as bonding wire connection electrodes, are connected to electrodes formed on an upper surface of an LSI chip. Metal pad portions connected to the multilayer wiring are formed on the uppermost layer of the bottom portion of the recess portion of the package substrate, and upper-surface electrodes of an LSI chip disposed to face downward are flip-chip connected to the metal pad portions. The resin sealing is performed by injecting a resin around and on the LSI chip mounted in the recess portion of the package substrate to the same height as the uppermost surface of the package substrate, such that the surface of the resin seal becomes flush with the upper surface of the package. Wiring on the upper surface of the resin is performed by ink-jet printing or screen printing in which metal particles are used. Copper particles may be used as the metal particles. In this case, a reduction process is carried out by use of atomic hydrogen.

According to a method of manufacturing a semiconductor device having a double-sided electrode structure of the present invention, a recess portion is formed in a package substrate which is formed of a multilayer organic substrate having a multilayer wiring and in which terminal wiring traces are connected to the multilayer wiring on front and back faces of the substrate. An LSI chip is accommodated within the recess portion. A resin is charged, for sealing, around and on the LSI chip to a height equal to that of the uppermost surface of the package substrate, the LSI chip being mounted in the recess portion of the package substrate and being connected to the multilayer wiring. Wiring traces which are connected to the terminal wiring traces on the front face of the package substrate are formed on the upper surface of the resin, and front-face bump electrodes for external connection are formed at distal ends of the wiring traces. Back-face bump electrodes for external connection which are connected to the terminal wiring traces on the back face of the package substrate are formed.

Effects of the Invention

According to the present invention, a high-density, thin double-sided electrode package can be readily manufactured at low cost through employment of a devised package substrate, rather than side-surface wiring or internal connection.

Further, according to the present invention, a plurality of chips can be readily incorporated into a single substrate. In addition, an arbitrary number of wiring traces can be extended to arbitrary positions of upper and lower portions of the substrate, and rewiring can be freely formed on the upper surface of the substrate, whereby flexibility can be imparted to a pattern of connection with an upper side IC.

BRIEF DESCRIPTION OF THE DRAWINGS

FIGS. 6(A) and 6(B) are views showing a state in which a cavity portion is sealed with a resin, wherein FIG. 6(A) is a sectional view, and 6(B) is a perspective view.

FIG. 7 is a view used for explaining rewiring on a front face of a mold.

FIG. 8 is a view used for explaining connection of bump electrodes.

FIG. 9 is a pair of plan views exemplifying wiring patterns different from that of FIG. 1(B).

BEST MODE FOR CARRYING OUT THE INVENTION

Figure 1A:
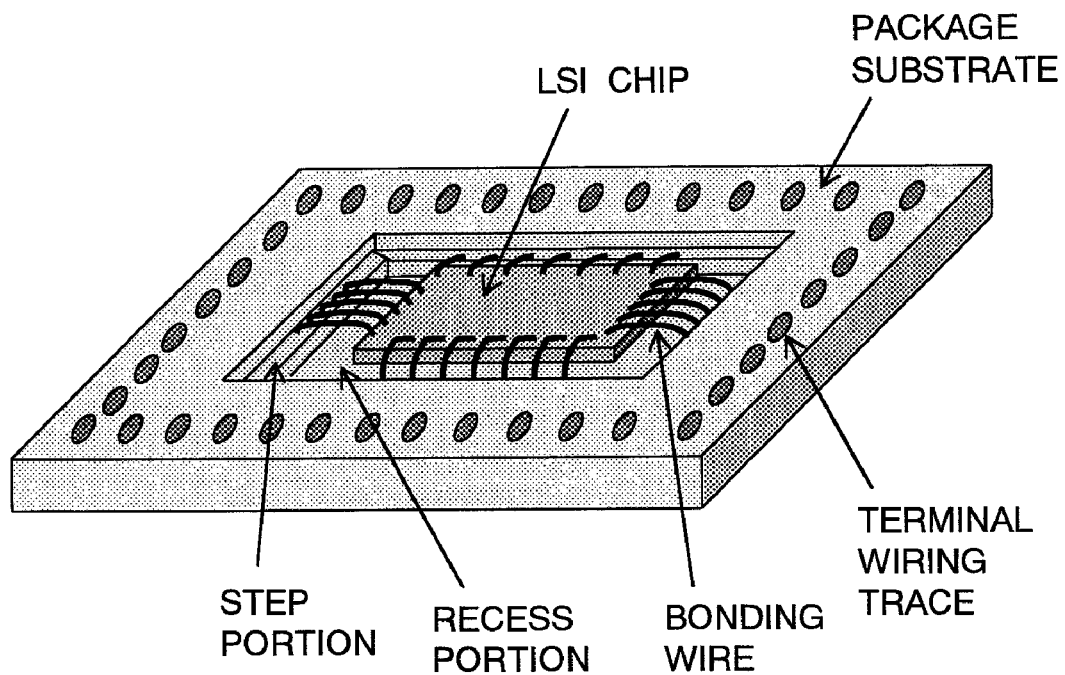
FIG. 1 is a pair of views exemplifying a semiconductor device having a double-sided electrode structure (an organic-substrate-type double-sided electrode package) of the present invention.
Figure 1B:
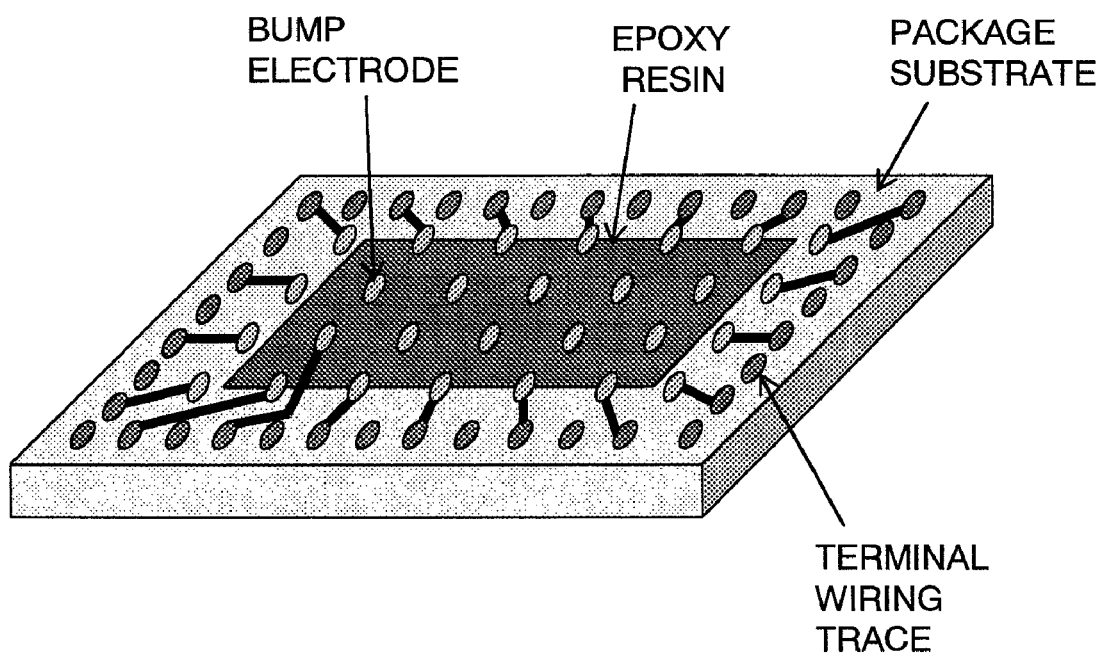

The present invention will now be described by way of examples. FIG. 1 is a pair of views exemplifying a semiconductor device having a double-sided electrode structure (an organic-substrate-type double-sided electrode package) of the present invention. FIG. 1(A) is a perspective view of the package, as viewed from the upper side thereof, the view showing a state in which an LSI chip is accommodated in a package substrate, and wire bonding is performed. FIG. 1(B) is a perspective view of the package, as viewed from the upper side thereof, the view showing a state in which rewiring is performed after resin sealing, and bumps for external connection are formed, whereby the package is completed.

As shown in FIG. 1(A), the package substrate formed from a multilayer organic substrate with multilayer wiring has a recess portion for accommodating the LSI chip, and a step portion formed around the recess portion. In addition to the back face side and the front face side, the multilayer organic substrate includes a wiring layer on the bottom surface of the recess portion and the step portion, respectively. In FIGS. 1(A) and 1(B), the front-face-side wiring layer is shown as terminal wiring traces. Similarly, the terminal wiring traces are also provided on the back face side of the multilayer organic substrate, on the bottom surface of the recess portion (for flip chip connection), and on the step portion (for wire bonding). Metal pad portions (terminal wiring traces) on the upper surface of the step portion, which are connected to the wiring layers of the multilayer organic substrate, serve as bonding wire connection electrodes, and are connected via Au wires to electrodes formed on the upper surface of the LSI chip. Alternatively, downward-facing upper-surface electrodes of the LSI chip may be flip-chip-connected to metal pad portions (terminal wiring traces) of the uppermost layer at the bottom of the recess portion. Notably, in the case of wire boding connection, the wiring layer at the bottom of the recess portion is not necessarily required; however, even when wiring is present at a die bonding portion, die bonding can be performed without any problem if an insulating layer is applied thereto or an insulative die bond material is used.

As shown in FIG. 1(B), after wire bonding, the package substrate is sealed with an epoxy resin in order to protect the package substrate from external stress and contamination. This resin sealing is performed by injecting the resin into a space around the LSI chip disposed within the recess portion of the multilayer organic substrate, and on the upper surface of the LSI chip (a cavity portion), to the same height as the uppermost surface of the package substrate, such that the surface of the resin seal becomes flush with the upper surface of the package. After that, on the front face of the resultant mold, there are formed wiring traces for connection with the terminal wiring traces formed on the uppermost surface of the package substrate (rewiring). The wiring traces extending from the upper surface of the package substrate are formed to extend to the resin surface by means of screen printing or ink-jet printing which uses nano-particles of metal (in particular, nano-particles of copper). Bump electrodes (connection projections), which serve as terminals for external connection, are formed at the distal ends of the wiring traces extending to the resin surface. The bump electrodes are formed not only on the front face but also on the back face. As shown in FIG. 1(B), in order to dispose the bump electrodes at equal intervals, instead of extending the wiring traces to the resin surface (rewiring), wiring traces may be extended within the package substrate, with bump electrodes formed at the distal ends of the wiring traces. Further, excessive bump electrodes which are not connected to anything may be provided in order to secure the strength of vertical connection.

Figure 2A:
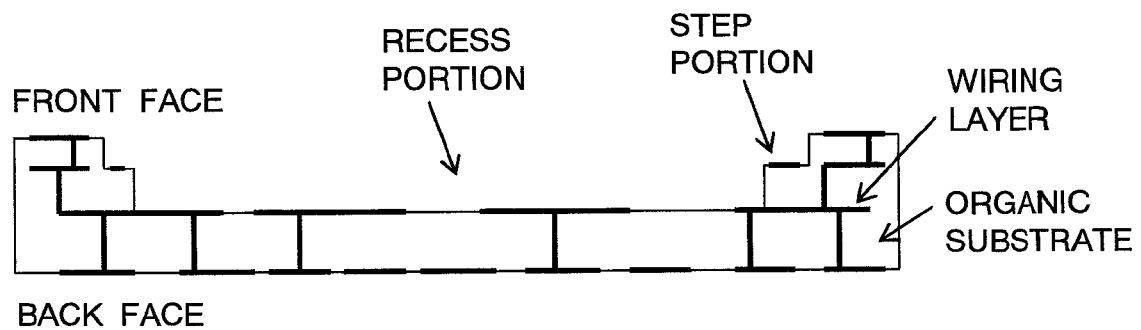
FIG. 2(A) is a sectional view of a package substrate.
Figure 2B:
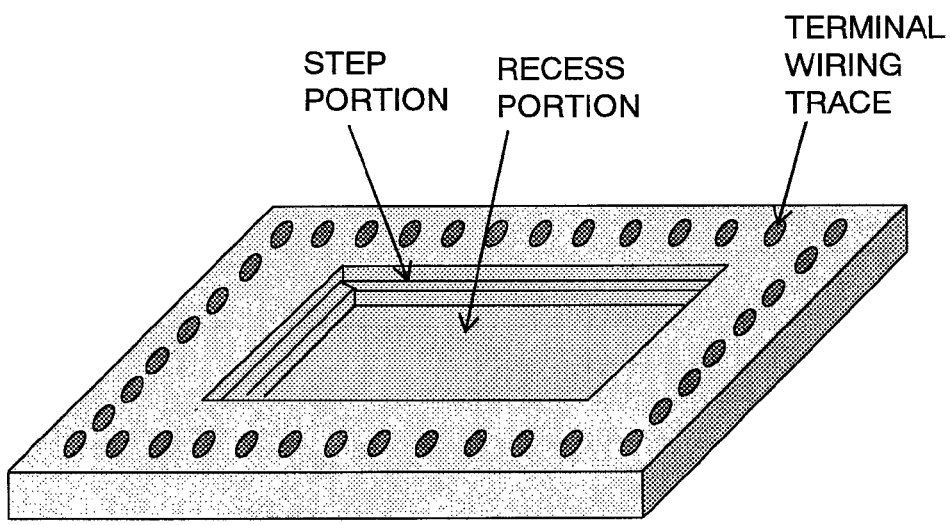
FIG. 2(B) is a perspective view of the package substrate.

Next, the details of a manufacturing process of the above-described semiconductor device having a double-sided electrode structure (the organic-substrate-type double-sided electrode package) will be further described with reference to FIGS. 2 to 8. FIG. 2(A) is a sectional view of a package substrate, and FIG. 2(B) is a perspective view of the package substrate. The package substrate formed from a multilayer organic substrate with multilayer wiring has a recess portion for accommodating an LSI chip, and a step portion formed around the recess portion. The multilayer organic substrate has advantageous features. That is, since its circuit is formed of a conductor of a pure metal (copper), the electrical resistance of the circuit is very low. In addition, since its insulating layers are formed of an organic resin, the dielectric constant of the insulating layers is low, and the multilayer organic substrate is light in weight. The wiring layers (including terminal wiring traces) of the multilayer organic substrate are formed on the bottom surface of the recess portion and the step portion, respectively, as well as on the back face side and the front face side of the substrate. The terminal wiring traces of FIG. 2(B) are the font-face-side wiring layer. In the illustrated example, the step portion having the terminal wiring traces for connection to the LSI chip is provided along all four sides of the rectangular recess portion. However, such a step portion is not necessarily required to be provided along all of the four sides. Notably, in the illustrated organic-substrate-type double-sided electrode package, the surface on which the recess portion is formed to accommodate a semiconductor chip is referred to as the front face, and the opposite surface is referred to as the back face.

The multilayer organic substrate is fabricated in such a manner that a wiring pattern is formed on each of the layers of a multilayer substrate, and, if necessary, via holes are formed so as to connect the wiring pattern of the layers. A conductor layer is formed in each via hole, and is connected to a land (an end surface electrode portion) formed on the lower surface side. Further, a solder material is applied to the land so as to form a bump electrode for external connection.

Next, an example method of manufacturing the above-described package substrate will be described with reference to FIG. 3. First, in a step shown in FIG. 3(A), copper film for forming a metal conductor is formed on the upper and lower surfaces of an organic resin insulating layer (substrate) formed of glass epoxy. The copper film can be formed through, for example, chemical plating.

Figure 3A:
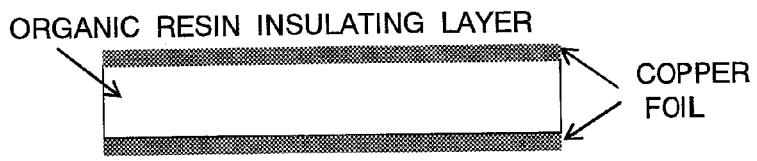
FIG. 3 is a set of views used for explaining an example method of manufacturing the package substrate.
Figure 3B:
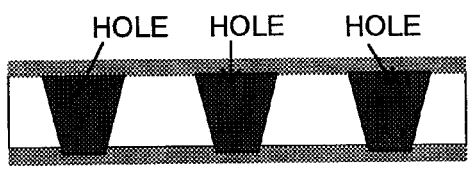

In a step shown in FIG. 3(B), hole (via hole) forming machining is performed by use of a laser, whereby spaces for three-dimensional connection are formed in the insulating layer; that is, via portions are formed so as to interconnect wiring patterns which are formed on the upper and lower surfaces of the insulating layer in a step shown in FIG. 3(D), which will be described later.

Figure 3C:
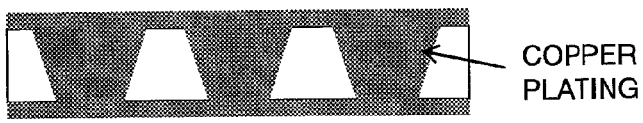

In a step shown in FIG. 3(C), after removal (desmearing) of residues within the via holes, the via holes are filled with copper plating.

Figure 3D:

In a step shown in FIG. 3(D), wiring patterns are formed by use of the copper films on the upper and lower surfaces. The wiring patterns are formed by applying photo resist to the copper foils on the insulting layer, transferring corresponding patterns thereto through mask exposure, and performing development, etching, resist removal, etc.

Figure 3E:
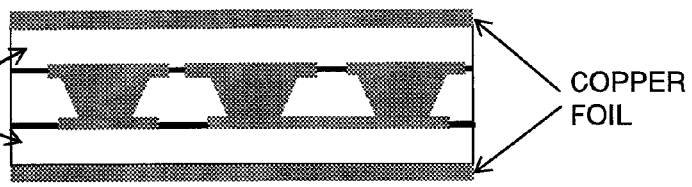

In a step shown in FIG. 3(E), an organic resin insulating layer (glass epoxy) is laminated (layered) on each of the upper and lower surfaces, and copper film is formed on each of the organic resin insulating layers.

Figure 3F:
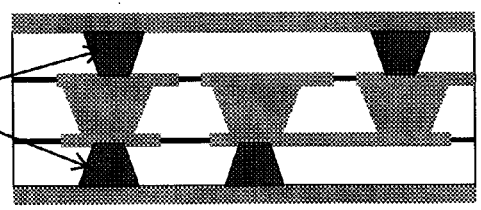

In a step shown in FIG. 3(F), by use of a laser, holes (via holes), which are to become via portions, are formed in the two newly formed organic resin insulating layers (glass epoxy).

Figure 3G:
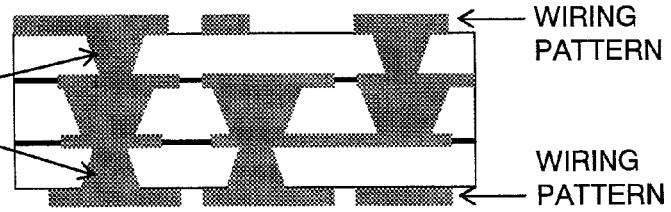

In a step shown in FIG. 3(G), after removal (desmearing) of residues within the via holes, the via holes are filled with copper plating. Subsequently, wiring patterns are formed from the upper and lower copper films, whereby a four-layer (wiring layer) substrate is completed.

Figure 4:
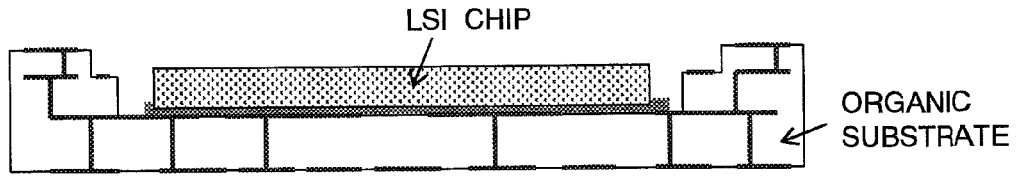
FIG. 4 is a view used for explaining chip die bonding for bonding an LSI chip.

Next, as shown in FIG. 4, an LSI chip is bonded (chip die bond). The LSI chip is bonded is bonded, by use of an insulative bond material, to the bottom surface of the recess portion formed in the multilayer organic substrate. In the illustrated example, a single LSI chip is incorporated into the substrate; however, a plurality of chips may be incorporated into the substrate, as will be described later with reference to FIG. 9(B).

Figure 5:
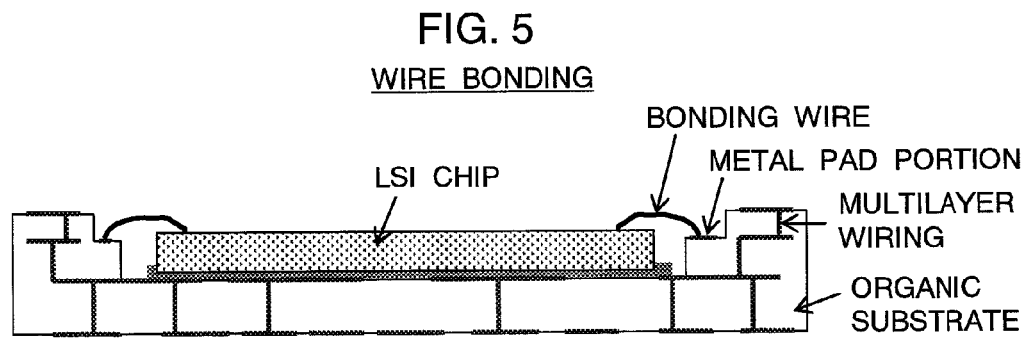
FIG. 5 is a view used for explaining wire bonding between a multilayer organic substrate and the LSI chip.

Next, as shown in FIG. 5, the multilayer organic substrate and the LSI chip are connected together by means of wire bonding. Metal pad portions (terminal wiring traces) are formed on step portions adjacent to the side walls of the recess portion of the multilayer organic substrate, and the metal pad portions are connected to the multilayer wiring layer. The metal pad portions, which serve as bonding wire connection electrodes, are connected, by use of Au wire, to electrodes formed on the upper surface of the LSI chip. The state after this wire bonding corresponds to that having been described with reference to FIG. 1(A).

Alternatively, by means of anisotropic conductive resin bonding or the like, the LSI chip may be flip-chip bonded to metal pad portions of the uppermost layer at the bottom portion of the recess portion. In the case of flip-chip connection, chip die bonding and electrode connection are carried out simultaneously. In the case of flip-chip connection, the LSI chip is connected such that its LSI-formed surface faces downward, whereby the upper surface electrodes of the downward-facing LSI chip are connected by wiring patterns (traces) including the metal pad portions of the uppermost layer at the bottom portion of the recess portion of the multilayer organic substrate. Notably, in the case of flip-chip connection, the step portions of the package substrate and the wiring layer provided on the step portions are not necessarily required.

Figure 6A:
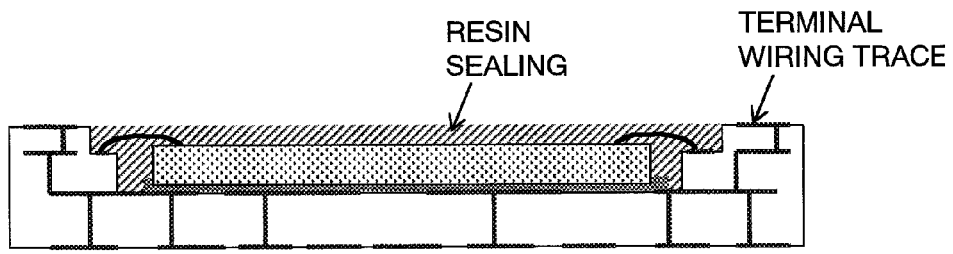
Figure 6B:
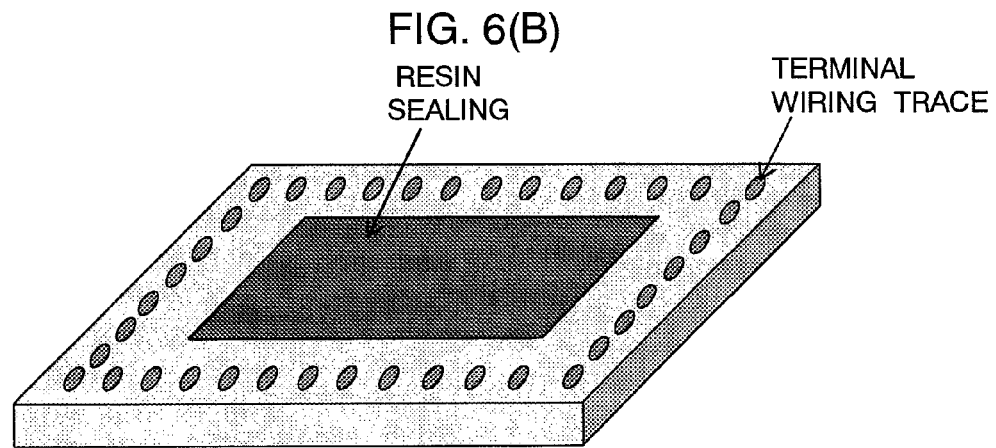

FIGS. 6(A) and 6(B) are views showing a state where the cavity portion is sealed by use of a resin, wherein FIG. 6(A) is a sectional view of the package substrate, and FIG. 6(B) is a perspective view of the package substrate. After wire bonding, the cavity portion is sealed with an epoxy resin in order to protect the LSI from external stress and contamination. This resin sealing is performed by injecting the resin (mold) into a space around the LSI chip disposed within the recess portion of the multilayer organic substrate, and on the upper surface of the LSI chip (the cavity portion), to the same height as the uppermost surface of the package substrate, such that the surface of the resin seal becomes flush with the upper surface of the package.

Next, as shown in FIG. 7, on the front face of a mold formed as a result of charging of the resin, there are formed wiring traces for connection with the metal pad portions (terminal wiring traces) formed on the uppermost surface of the package substrate (rewiring). The wiring traces extending from the upper surface of the package substrate are formed to extend to the resin surface, by means of screen printing or ink-jet printing which uses nano-particles of metal (in particular, nano-particles of copper). In the case of the ink-jet printing, nano-particles of copper contained in an organic solvent are applied in a desired pattern by an ink jet method practically employed in printers. After that, heat treatment is performed so as to evaporate the organic solvent. In the case of the screen printing, nano-paste prepared by mixing nano-particles of copper into an organic solvent is applied onto the substrate by a screen printing method, and the substrate is then fired through application of heat, whereby circuit wiring traces are formed. In the case where wiring traces are formed on the upper surface by use of nano-particles of copper, as will be described in detail, dirt and oxides are removed from copper wiring traces through a reduction process performed by use of atomic hydrogen.

FIG. 8 is a view showing a state after bump electrodes are connected to the substrate. Bump electrodes (connection projections), which serve as terminals for external connection, are formed at the distal ends of the wiring traces extending to the resin surface. The bump electrodes are formed not only on the front face but also on the back face. The front-face-side bump electrodes may be formed by a process of applying solder resist (formation of an insulating film) after the rewiring, forming holes serving as bump portions, and forming bump electrodes at the bump portions. Through the above-described steps, manufacture of the organic-substrate-type double-sided electrode package is completed.

FIGS. 9(A) and 9(B) are plan views exemplifying wiring patterns different from that of FIG. 1(B). FIG. 9(A) shows an example in which one LSI chip is incorporated into one package substrate, and FIG. 9(B) shows an example in which two LSI chips are incorporated into one package substrate.

In the above, manufacture of a single double-sided electrode package has been described as an example. However, in actuality, a large number of double-sided electrode packages are manufactured in a state where they are connected two-dimensionally, and are diced for separation after the step of FIG. 8; i.e., after formation of bump electrodes on the front and back faces.

As described above, in the case where wiring traces are formed on the upper surface by use of nano-particles of copper, a reduction process is performed by use of atomic hydrogen, whereby oxides and dirt on copper wiring traces attributable to the organic solvent are removed at a low temperature of 200° C. or lower. This reduction process will now be described.

(1) Copper wiring traces are formed by an ink-jet method.

Nano-particles of copper contained in an organic solvent are applied in a desired pattern by an ink jet method practically employed in printers. Subsequently, heat treatment is performed so as to evaporate the organic solvent.

In the present invention, oxides and dirt attributable to the organic solvent are removed from the copper wiring traces formed in a manner described above. In the case where heat treatment is performed so as to evaporate the organic solvent, through surface oxidation of copper, copper oxide is formed. However, this copper oxide can be removed through subsequent atomic hydrogen treatment. The present invention can be applied to the case where heat treatment for evaporating the organic solvent is not performed. In the case where heat treatment is not performed, the organic solvent remains. However, the organic solvent can be removed through subsequent atomic hydrogen treatment.

(2) Next, in a copper wiring cleaning apparatus, the copper oxide and the organic solvent dirt are removed by use of atomic hydrogen or an ammonia-decomposed-specie.

Figure 10:
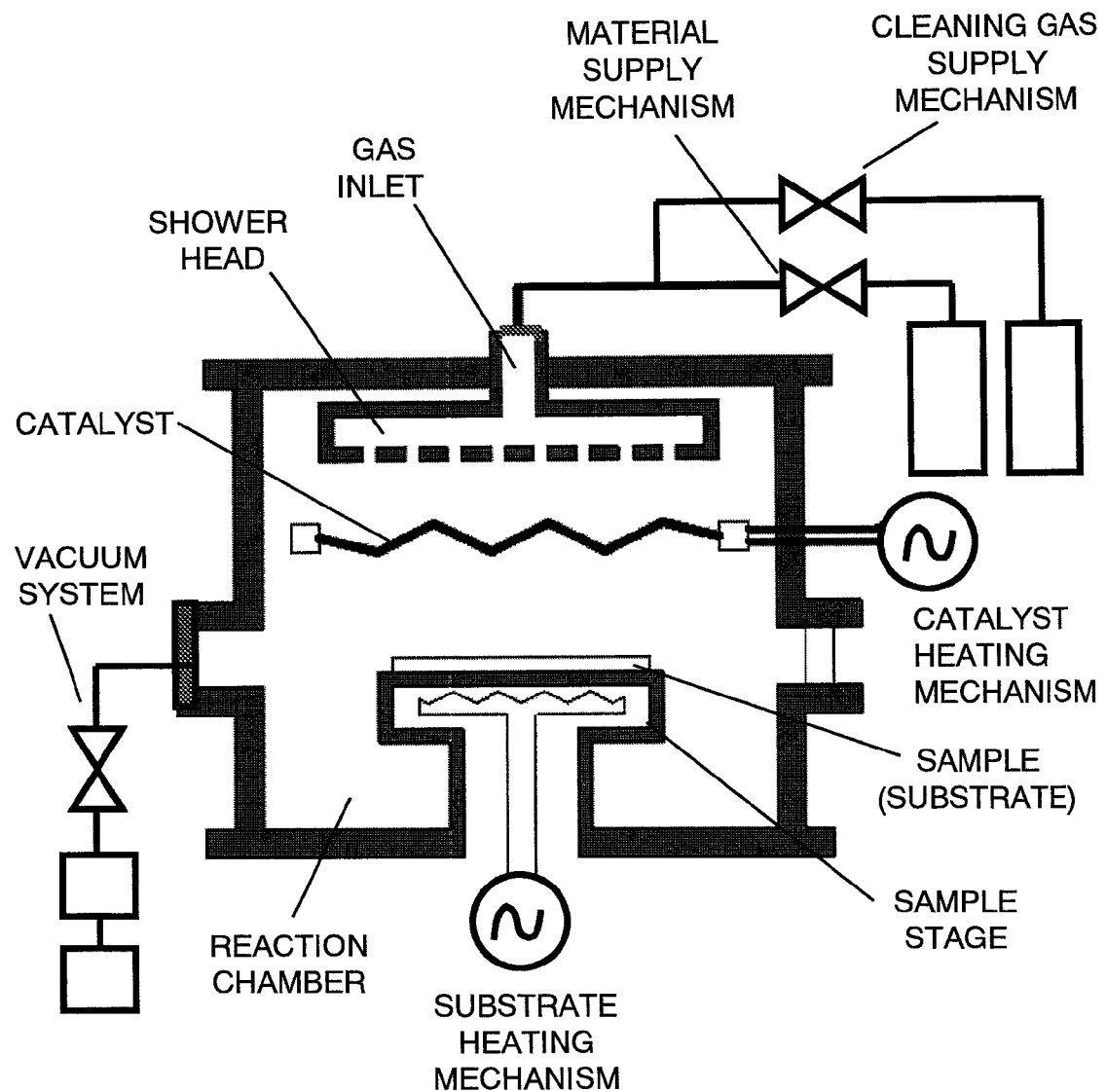
FIG. 10 is a schematic view, in cross section, of a processing apparatus used as a copper wiring cleaning apparatus.

FIG. 10 is a schematic view, in cross section, of a processing apparatus used as a copper wiring cleaning apparatus. A cleaning gas supply mechanism supplies into a reaction chamber, via a gas inlet formed in the upper wall of the reaction chamber, a hydrogen-containing raw material, such as hydrogen, ammonia, or hydrazine, as a raw material of atomic hydrogen or ammonia-decomposed species.

A substrate heating mechanism such as a heater is disposed underneath the reaction chamber, and a sample stage is provided within the reaction chamber to be located immediately above the heating mechanism. A sample (a substrate) is placed on the sample stage such that the surface on which wiring traces are formed faces upward. A catalyst formed of, for example, tungsten wire is disposed between the sample and a shower head for diffusing the gas from the gas inlet. A catalyst heating mechanism heats the catalyst to a high temperature so as to decompose the gas having flowed into the chamber. Thus, atomic hydrogen or ammonia-decomposed species are generated as a result of a catalytic cracking reaction caused by the heated catalyst. Oxides of the copper wiring traces are removed through reduction of atomic hydrogen, and organic dirt is removed thorough formation of hydro carbon as a result of reaction between atomic hydrogen and carbon.

Compounds containing nitrogen, such as ammonia and hydrazine, may be used as the above-described hydrogen-containing compound, which is the raw material of atomic hydrogen or ammonia-decomposed species. In such a case, when a gas of such a compound comes into contact with the heated catalyst, atomic nitrogen is generated simultaneously with generation of atomic hydrogen, whereby metal surfaces can be nitrided by atomic nitrogen, simultaneously with reduction of oxide film on metal surfaces and/or removal of organic substances by atomic hydrogen.

In addition to the above-mentioned tungsten, the catalyst may be formed of an element selected from a group consisting of tantalum, molybdenum, vanadium, rhenium, platinum, thorium, zirconium, yttrium, hafnium, palladium, iridium, ruthenium, iron, nickel, chromium, aluminum, silicon, and carbon; an oxide of any one of these elements; a nitride of any one of these elements; a carbide of any one of these elements (excluding carbon); an oxide of a mixed crystal or compound formed of two or more elements selected from the group; a nitride of a mixed crystal or compound formed of two or more elements selected from the group; or a carbide of a mixed crystal or compound formed of two or more elements selected from the group (excluding carbon). In the case where the catalyst is formed of tungsten, preferably, the catalyst is heated to a temperature within a range of 1000° C. to 2200° C.

Notably, a material supply mechanism in FIG. 10 is used to supply hexamethyldisilazane, shiran, or the like so as to deposit, for example, SiN-based film when necessary. Further, a vacuum system is used to discharge reaction residual gasses.

A wafer (including a plurality of packages connected two-dimensionally) on which wiring traces are formed by use of nano copper particles, or package substrates diced from the wafer are placed on the sample stage of the copper wiring cleaning apparatus, as a sample (substrate). Subsequently, in order to remove contaminants originating from wiring by use of nano copper particles, hydrogen gas is supplied at a flow rate of 30 sccm for 10 minutes. Thus, the contaminants are removed.

The invention claimed is:

1. A semiconductor device having a double-sided electrode structure in which
a recess portion is formed in a package substrate which is formed of a multilayer organic substrate having a multilayer wiring, and an LSI chip is accommodated within the recess portion;
a resin is charged, for sealing, around and on the LSI chip to a height equal to that of the uppermost surface of the package substrate, the LSI chip being mounted in the recess portion of the package substrate and being connected to the multilayer wiring;
wiring traces are formed on an upper surface of the charged resin such that the wiring traces are connected to terminal wiring traces connected to the multilayer wiring on a front face of the package substrate, and are connected to front-face bump electrodes for external connection on the upper surface of the resin; and
on the back face side of the package substrate, back-face bump electrodes for external connection are formed and connected to the multilayer wiring.

2. A semiconductor device having a double-sided electrode structure according to claim 1, wherein step portions are formed around the recess portion of the package substrate, and the terminal wiring traces connected to the multilayer wiring are formed on the step portions; and the terminal wiring traces, which serve as bonding wire connection electrodes, are connected to electrodes formed on an upper surface of an LSI chip.

3. A semiconductor device having a double-sided electrode structure according to claim 1, wherein metal pad portions connected to the multilayer wiring are formed on the uppermost layer of the bottom portion of the recess portion of the package substrate, and upper-surface electrodes of an LSI chip disposed to face downward are flip-chip connected to the metal pad portions.

4. A semiconductor device having a double-sided electrode structure according to claim 1, wherein wiring on the upper surface of the resin is performed by ink-jet printing or screen printing in which metal particles contained in an organic solvent are used.

5. A semiconductor device having a double-sided electrode structure according to claim 4, wherein the metal particles are copper particles, and a reduction process is carried out by use of atomic hydrogen.

6. A method of manufacturing a semiconductor device having a double-sided electrode structure, comprising the steps of:
forming a recess portion in a package substrate which is formed of a multilayer organic substrate having a multilayer wiring and in which terminal wiring traces are connected to the multilayer wiring on front and back faces of the substrate;
accommodating an LSI chip within the recess portion;
charging a resin around and on the LSI chip to a height equal to that of the uppermost surface of the package substrate, the LSI chip being mounted in the recess portion of the package substrate and being connected to the multilayer wiring;
forming, on an upper surface of the resin, wiring traces which are connected to the terminal wiring traces on the front face of the package substrate, and forming front-face bump electrodes for external connection at distal ends of the wiring traces; and
forming back-face bump electrodes for external connection which are connected to the terminal wiring traces on the back face of the package substrate.

7. A method of manufacturing a semiconductor device having a double-sided electrode structure according to claim 6, wherein step portions are formed around the recess portion of the package substrate, and the terminal wiring traces connected to the multilayer wiring are formed on the step portions; and the terminal wiring traces, which serve as bonding wire connection electrodes, are connected to electrodes formed on an upper surface of an LSI chip.

8. A method of manufacturing a semiconductor device having a double-sided electrode structure according to claim 6, wherein metal pad portions connected to the multilayer wiring are formed on the uppermost layer of the bottom portion of the recess portion of the package substrate, and upper-surface electrodes of an LSI chip disposed to face downward are flip-chip connected to the metal pad portions.

9. A method of manufacturing a semiconductor device having a double-sided electrode structure according to claim 6, wherein wiring on the upper surface of the resin is performed by ink-jet printing or screen printing in which metal particles contained in a solvent are used.

10. A method of manufacturing a semiconductor device having a double-sided electrode structure according to claim 9, wherein the metal particles are copper particles, and a reduction process is carried out by use of atomic hydrogen.

* * * * *